POWER DRIVE CIRCUIT FOR SERVOMOTORS AND THE LIKE
Filed Jan. 18, 1963
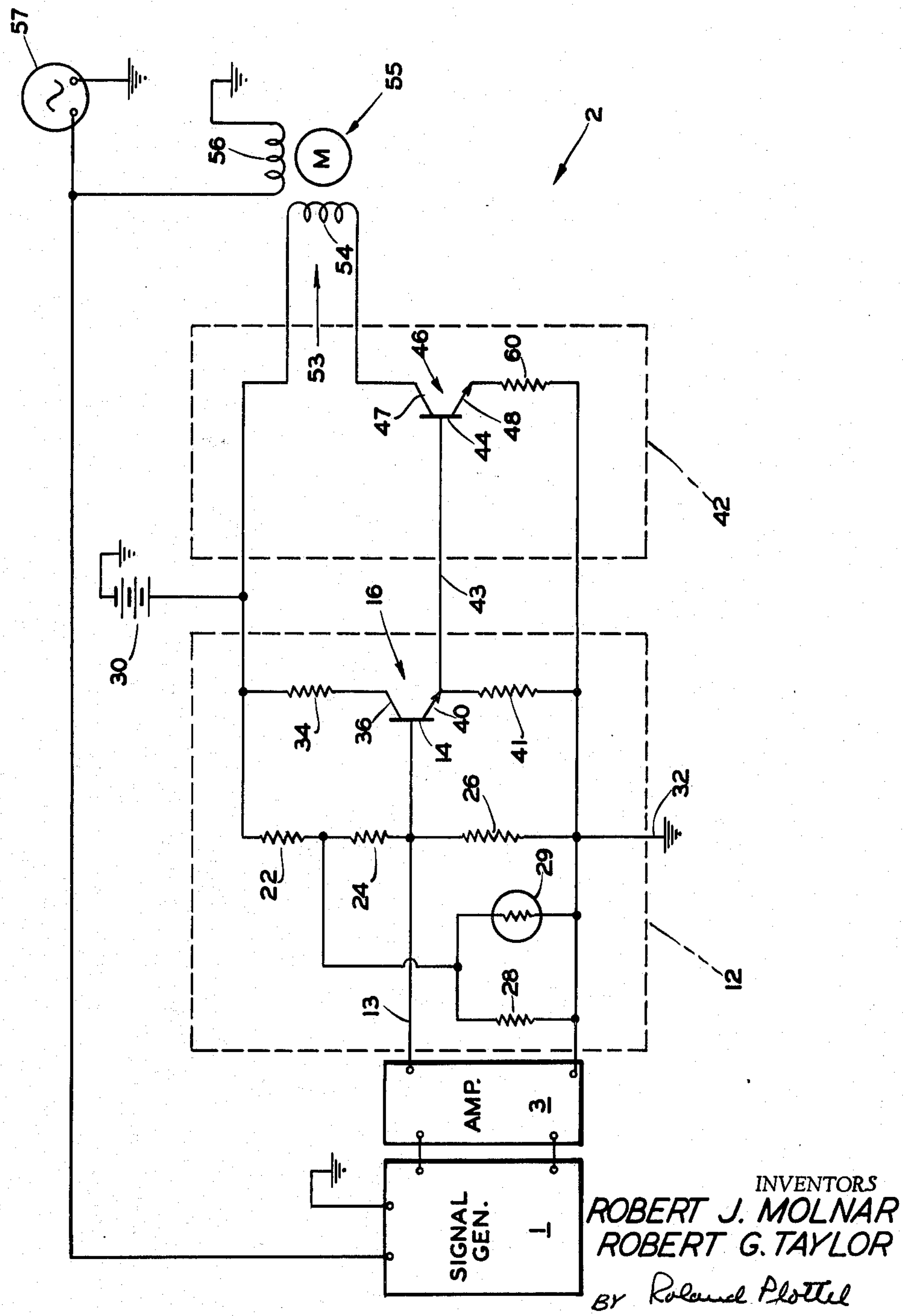
INVENTORS
ROBERT J. MOLNAR
ROBERT G. TAYLOR
BY Roland Plottel
ATTORNEY United States Patent Office 3,234,446

Patented Feb. 8, 1966

3,234,446

POWER DRIVE CIRCUIT FOR SERVOMOTORS AND THE LIKE

Robert J. Molnar, Bronx, N.Y., and Robert G. Taylor, Pompton Lakes, N.J., assignors to The Bendix Corporation, Teterboro, N.J., a corporation of Delaware Filed Jan. 18, 1963, Ser. No. 252,482
9 Claims. (Cl. 318—207)

The invention relates generally to power drive circuits and in particular to an open ended power drive circuit for driving servomotors and the like.

One object of the invention is to provide a novel power drive circuit for driving servomotors and the like.

Another object of the invention is to provide a novel power drive circuit having a first power transistor driver stage which presents a high input impedance to preceding amplifier voltage stages, provides power gain, and a low output impedance to a second power transistor stage.

Conventional power drive circuits heretofore used have employed a medium power transistor preamplifier coupled by an impedance matching transformer to a pair of class B amplifiers arranged in push-pull configuration which are transformer coupled to a load. Disadvantages of the conventional circuits included a power waste within the preamplifier and a resulting lowered efficiency; the use of an expensive medium power transistor in the preamplifier, and two expensive power transistors in the push-pull configuration. An object of the present invention is to provide a novel power-transistor-driver preamplifier stage having low power dissipation during standby and good efficiency during operation, and operable with the use of a relatively inexpensive small signal transistor thus providing an economy of power and an economy in the cost of construction. A further object of the invention is to provide a novel driver circuit having an open-ended rather than push-pull power stage thus requiring only a single power transistor in the power stage.

Further disadvantages of the conventional circuit, as heretofore used, arose from the use of transformers—in particular, the impedance matching transformer between the preamplifier and the power stage, and the coupling transformer between the power stage and the load. The transformers were large in size, heavy in weight, and introduced phase distortion. The phase distortion becomes more pronounced when the transformers are made smaller in size and weight. Thus, for servomotor drives in aircraft and other applications where size and weight are important, and phase shift intolerable, the conventional circuits were not satisfactory. Thus a further object of the present invention is to provide a novel power drive circuit which does not require transformers either for coupling or impedance matching. A still further object and extremely valuable feature of the invention is to provide a circuit having a medium phase shift between input and output signals, and a first response time between input and output signals.

These and other objects and features of the invention are pointed out in the following description in terms of the embodiment thereof which is shown in the accompanying drawing. It is to be understood, however, that the drawing is for the purpose of illustration only and is not a definition of the limits of the invention, reference being had to the appended claims for this purpose.

There is shown a schematic drawing of a network including a power drive circuit constructed in accordance with the invention. An input alternating signal voltage $e_{in}$ is applied from a suitable signal generating device 1 of conventional type to a power drive circuit 2 through a conventional voltage amplifier stage indicated generally by the numeral 3 and which may be of a type having a high output impedance.

The input voltage $e_{in}$ is applied directly to a first preamplifier or power transistor driver stage 12 through a conductor 13 which is connected directly to a base 14 of a driver transistor 16 which may be of a small signal transistor type. The transistor 16 is biased for class AB service by a conventional bias network made up of resistors 22 through 29, interconnected with a source of D.C. excitation 30, a ground potential 32, and the base 14 of the transistor 16. Bias resistors 22, 24, and 26 are connected in series between the source of excitation 30 and the ground potential 32. The junction of resistors 24 and 26 is connected to the conductor 13 and the base 14, and the junction of resistors 22 and 24 is connected through a resistor 28 to ground potential 32 and through a temperature sensitive resistor 29 to ground 32. Resistors 22, 28, and 29 form a temperature compensation network, which applies bias current to the base 14 through resistor 24. The resistor 24 prevents the temperature variable resistor 29 from causing very large variations in the circuit input impedance by swamping out any variations in the resistance of variable temperature sensitive resistor 29.

Transistor 16 has a collector 36 connected through a collector resistor 34 to the source of potential 30. The function of the collector resistor 34 is to hold the collector voltage on the collector 36 to a minimum level and thus dissipate within the resistor most of the power that would otherwise cause unnecessary heating of the transistor 16 if the collector resistor 34 were not present. With this use of resistor 34 and because of the AB class of operation, transistor 16 may be a small signal type transistor.

The transistor 16 has an emitter 40 connected to ground potential 32 through an emitter resistor 41. The resistance of emitter resistor 41 partially determines the input impedance of the first stage 12.

The first stage 12 is directly connected to the second stage 42 by a conductor 43 which applies an output voltage from emitter 40 to a base 44 of a power transistor 46 in a second or power stage 42.

The power transistor 46 has a collector 47 and an emitter 48. The collector 47 is connected to source 30 through a load 53 shown here as a control phase winding 54 of a two phase servomotor 55, of any convenient or conventional design. Motor 55 also has a fixed phase winding 56 connected across a suitable A.C. source 57 which provides an alternating voltage which may serve to energize the signal generator as well as the fixed phase winding 56. When an A.C. servomotor, of the kind shown in the drawing, is used as a load, the signal voltage applied to the control winding 54 must be of the same frequency but 90° phase displaced from the A.C. voltage applied to the fixed phase winding 56 from the source 57. The control phase winding 54 is shown here as an example of a typical load, and any other type of load which has a low input impedance may be used.

The foregoing 90° phase displacement in the signal voltage applied to the control winding 54 from that applied to the fixed phase winding 56 may be effected in the amplifier 3 by suitable means or this may be effected by a capacitor in the output to the control winding 54 in a conventional manner.

Power transistor 46 has the emitter 48 connected to the ground potential 32 by an emitter resistor 60. Emitter resistor 60 partially determines and stabilizes the input impedance of the second stage 42.

The power transistor 46 is operated class B with just enough bias current to eliminate the dead zone. The bias for transistor 46 is provided by the first stage 12. As noted above, transistor 16 is biased for class AB service, and collector resistor 34 holds the collector voltage on collector 36 down to a minimum level so that most power is dissipated in the resistor 34, which would otherwise cause unnecessary heating of transistor 16. This action cooperates with bias of the second stage because it is never necessary for the emitter 40 of transistor 16 to be more than a few volts above ground and since the emitter 40 of transistor 16 is directly connected through conductor 43 to the base 44 of power transistor 46, thus, transistor 46 is biased class B.

The structure of the circuit having been described, the impedance matching of various stages and the power gain delivered to the load and second stage 42 will now be examined in detail.

The input impedance of the first stage 12 as presented to previous amplifier stages is approximately equal to the parallel combination of the biasing network made up of resistors 22 through 29 and the actual input impedance of transistor 16, which is approximately equal to the base 14 to emitter 40 resistance of transistor 16; plus the forward current transfer ratio of the beta of transistor 16 plus one, multiplied by the input impedance of transistor 46 (which is defined below) in parallel with emitter resistor 41. Because transistor 16 is a small signal transistor, the biasing resistors 22 through 29, of necessity, are very large, and also since the beta of transistor 16 is high, thus the input impedance of the power drive circuit 12 as presented to the amplifier 3 is very high and thus may be made to match the output impedance of the amplifier 3. This high input impedance of the power drive circuit 12 minimizes the loading down of the preceding voltage amplifying stage 3 thereby permitting greater voltage gain.

The output impedance of the first stage 12, i.e. the impedance that transistor 16 presents to the power transistor 46 is approximately equal to the output impedance of the amplifier 3 divided by the beta of transistor 16.

Thus, the first stage 12 presents a high impedance at its input between conductor 13 to reference potential 32 which is made substantially equal to the high output impedance of the amplifier 3; and stage 12 presents a medium impedance at its output across emitter resistor 41. For example, the high output impedance of the amplifier 3 may be on the order of several thousand ohms and the medium output impedance of the first stage 12 would be on the order of hundreds of ohms.

The input impedance of the second stage 42, i.e. the impedance of power transistor 46, is equal to the base 44 to emitter 48 resistance of the transistor itself, plus the beta of the transistor 46 plus one, multiplied by the resistance of emitter resistor 60 which is a medium impedance. The medium output impedance of the first stage 12 can thus be made to match the medium input impedance of the power stage 42.

The voltage gain of the first or drive stage of the invention is given by $$K=\frac{(\beta_{16}+1)R_{42}}{R_{12}+(\beta_{16}+1)R_{42}}$$

wherein $R_{12}$ is the input impedance of the first stage 12, $R_{42}$ is the input impedance to the second stage 42, and $\beta_{16}$ is the beta of transistor 16. The term $(\beta+1)R_{42}$, however, is several times larger than $R_{12}$; therefore, the voltage gain K is near unity and the impedance is transformed from a high to a low level so that power gain is achieved. This power gain is approximately equal to the beta of transistor 16.

Thus there has been shown a power transistor driver circuit finding use, for example, with servomotors. The circuit presents a high input impedance to the preceding voltage amplifying stage 3 and provides power gain and presents a low output impedance to the servomotor 55 or other load. It should be noted that the circuit of the invention requires neither an impedance matching transformer nor a coupling transformer; and thereby, in doing away with these components, is lighter in weight, smaller in size, has no phase shift and a faster time response than heretofore available from conventional servomotor drivers that used coupling and matching transformers.

There are many different values of circuit parameters for which the circuit shown in the drawing will function satisfactorily. Since the circuit parameters may vary according to the design for any particular application, the following circuit parameters are included for the circuit of the drawing by way of example only.

Transistor 16—2N336
Transistor 46—2N1721
Resistor 22—100K
Resistor 24—180K
Resistor 26—39K
Resistor 28—36K
Resistor 29—Type 1 thermistor 60K
Resistor 34—2.2K
Resistor 41—3.9K
Resistor 60—10Ω
Input voltage range—0–5 volts
Source input impedance—5K
Load 54—impedance $(100+j100)\Omega$
Source 30—+30 volts Although only one embodiment of the invention has been illustrated and described, various changes in the form and relative arrangement of the parts, which will now appear to those skilled in the art may be made without departing from the scope of the invention. Reference is, therefore, to be had to the appended claims for a definition of the limits of the invention.

What is claimed is:

1. A power drive circuit for driving the control winding of an alternating current servomotor comprising
   (a) a high impedance first source of control signals;
   (b) a second source of power referenced to a ground potential;
   (c) a first driver stage including a small signal transistor having a base directly connected to the high impedance source for receiving the control signal therefrom, a collector, and an emitter; means for biasing the small signal transistor for class AB service; a collector resistor connecting the collector of the small signal transistor to the second source for maintaining a small voltage on the collector; and an emitter resistor connecting the emitter to ground potential; and
   (d) a second power stage including a single power transistor operated at class B amplifier service having a base directly connected to the emitter of the small signal transistor, said power transistor including an emitter resistively connected to ground, and a collector connected through the servomotor control winding to the source of power; the power driver circuit providing power to the servomotor.

2. A power drive circuit for driving the control winding of a servomotor comprising
   (a) a first high impedance source of control signals;
   (b) a second source of power referenced to the ground potential;
   (c) a first drive stage including a small signal transistor having a base directly connected to the first high impedance source for receiving the control signal therefrom; said small signal transistor including a collector and an emitter; means for biasing the transistor for class AB amplifier service, a collector resistor connecting the collector to the second source for maintaining a small voltage drop from the collector to the emitter; and an emitter resistor connecting the emitter to ground potential; said first stage presenting to the first high impedance source an impedance across the emitter resistor substantially less than the input impedance;
   (d) a second power stage including a signal power transistor operated at class B service and having a base directly connected to the emitter of the small signal transistor, an emitter resistively connected to reference potential and a collector connected through the servomotor control winding to the source of power, said second stage presenting to the first stage an impedance substantially equal to the output impedance of the first stage, and to the servomotor control winding a low impedance substantially equal to the impedance of the control winding.

3. The combination defined by claim 2 with the input impedance of the first stage being approximately equal to a parallel combination of the impedance of the biasing means and the resistance of the emitter resistor of the small signal transistor plus a forward current conduction ratio beta of the small signal transistor pluse one multiplied by the input impedance to the power stage.

4. The combination defined by claim 2 with the output impedance of the first stage being approximately equal to the impedance of the source divided by the forward conduction ratio beta of the small signal transistor.

5. The combination defined by claim 2 with the output impedance of the power stage being substantially equal to the base to emitter resistance of the power transistor plus the forward current conduction ratio of the power transistor plus one multiplied by the resistance of the emitter resistor.

6. A power drive circuit for driving low impedance loads from a high impedance signal source comprising a small signal transistor having a base connected to the source for receiving signals therefrom, an emitter and a collector; an emitter resistor connecting the emitter to a reference potential and providing an impedance match between said base and the high impedance of the source, a collector resistor connecting the collector to a source of potential for maintaining a small potential drop between the collector and the emitter; a biasing network interconnected between the source of potential, the reference potential, and the base for biasing the transistor at class AB service and maintaining a high input impedance at the base; a power transistor having a base directly connected to the emitter of the small signal transistor, an emitter, and a collector, the power transistor being biased for class B amplifier service by the direct connection between the base and the emitter and the bias of the previous transistor; an emitter resistor connecting the emitter of the power transistor to the reference potential for stabilizing the power transistor, and for providing impedance matching between the power transistor and the small signal transistor; and a low impedance load connecting the collector of the power transistor to the source of potential.

7. The combination defined by claim 6, the base of the small signal transistor being directly connected to the high impedance source.

8. The combination defined by claim 6 with the load being part of a two phase alternating current servomotor having a control phase winding connected as a load between power transistor collector and the source of potential, a fixed phase winding, and a source of alternating potential connected across the fix phase winding, the frequency of said alternating source being equal to the frequency of the signal and the signal across the winding being phase displaced 90° from each other.

9. A power drive circuit for driving the control winding of a servomotor, comprising a high impedance source of control signals, a source of power referenced to ground potential, a drive stage including a signal transistor having a base connected to the high impedance source for receiving the control signals therefrom, said transistor including a collector and an emitter, a collector resistor connecting the collector to the source of power for maintaining a small voltage drop from the collector to the emitter, and an emitter resistor connecting the emitter to ground potential, said drive stage presenting to the high impedance source an impedance across the emitter resistor substantially less than the input impedance, a power stage including a power transistor having a base directly connected to the emitter of the signal transistor, an emitter resistively connected to reference potential and a collector connected through the servomotor control winding to the source of power, said power stage presenting to the drive stage an impedance substantially equal to the output impedance of the drive stage and to the servomotor control winding a low impedance substantially equal to the impedance of the control winding.

References Cited by the Examiner

UNITED STATES PATENTS

| | | | |
|---|---|---|---|
| 2,595,496 | 5/1952 | Webster | 330—32 |
| 2,858,379 | 10/1958 | Stanley | 330—19 |
| 2,951,991 | 9/1960 | Rickner et al. | 330—32 |
| 3,031,627 | 4/1962 | Reichert et al. | 330—20 |
| 3,075,151 | 1/1963 | Murray | 330—20 |
| 3,101,437 | 8/1963 | Photinos | 318—207 |
| 3,103,615 | 9/1963 | Vitale | 318—207 |

JOHN F. COUCH, *Primary Examiner.*